United States Patent [19]

Hanajima

[11] Patent Number: 5,614,865
[45] Date of Patent: Mar. 25, 1997

[54] DIFFERENTIAL AMPLIFIER WITH IMPROVED OPERATIONAL RANGE

[75] Inventor: Mitsutada Hanajima, Tokyo, Japan

[73] Assignee: Ando Electric Co., Ltd., Tokyo, Japan

[21] Appl. No.: 526,883

[22] Filed: Sep. 12, 1995

[30] Foreign Application Priority Data

Sep. 30, 1994 [JP] Japan .................................. 6-261736

[51] Int. Cl.$^6$ ........................................................ H04F 3/45
[52] U.S. Cl. ............................................................ 330/254
[58] Field of Search ................................. 330/252, 254, 330/261, 51

[56] References Cited

U.S. PATENT DOCUMENTS

| | | | |
|---|---|---|---|
| 4,369,410 | 1/1983 | Fenk | 330/254 |
| 5,406,221 | 4/1995 | Sanani et al. | 330/254 |
| 5,461,342 | 10/1995 | Crabtree | 330/252 |

Primary Examiner—Steven Mottola
Attorney, Agent, or Firm—Flynn, Thiel, Boutell & Tanis, P.C.

[57] ABSTRACT

A variable amplitude type differential amplifier capable of reducing power consumption without lowering the frequency characteristics even when large variations of output amplitude are desired. The differential amplifier includes first and second transistor pairs wherein bases of each transistor are connected to bases of the other transistors in the pair. The emitters of the first transistor and that of the second transistor are common with each other, and an emitter of the third transistor and that of the fourth transistor are common with each other, wherein current sources are connected with each common emitter pair. The current sources activate only one common transistor pair at a time. A resistor is connected between the collector of first transistor and a voltage source. A second resistor is connected between a collector of the second transistor and the voltage source. A further resistor is connected between the collectors of the first and third transistors, and another resistor is connected between the collectors of the second and fourth transistors. The output is taken from the node connecting the further resistor to the third transistor.

15 Claims, 2 Drawing Sheets

FIG. I
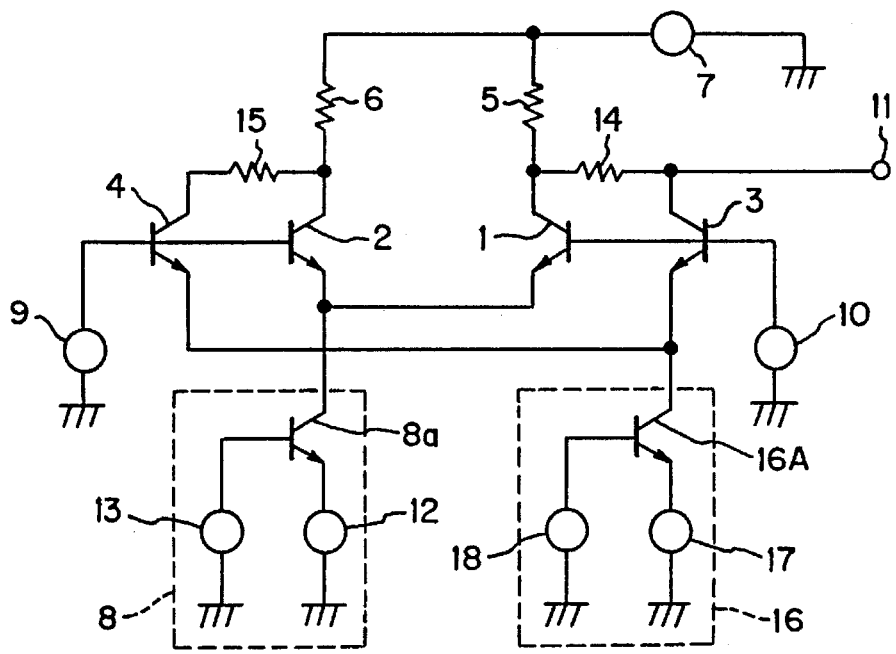
FIG. 2
PRIOR ART
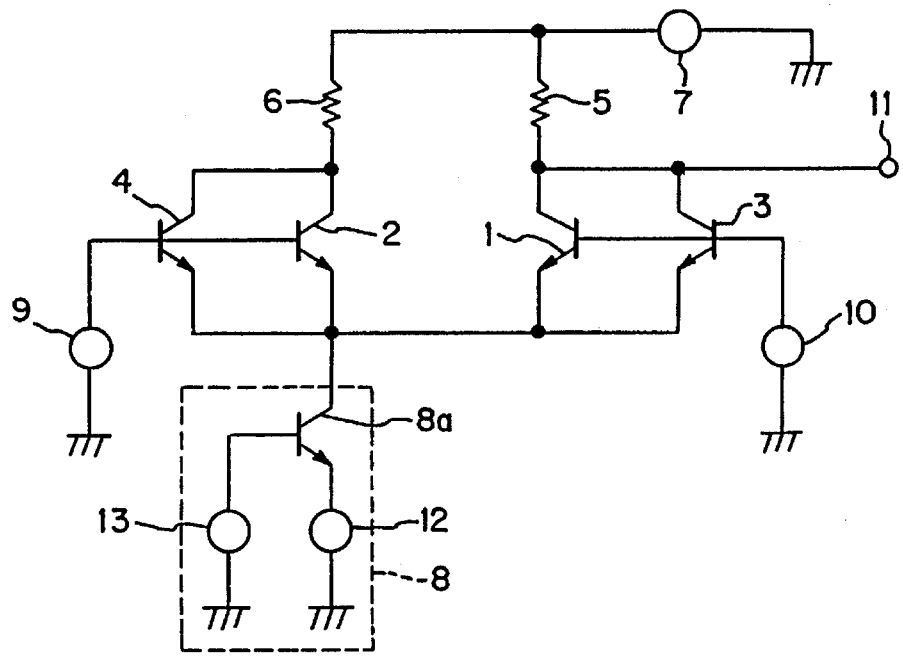

DIFFERENTIAL AMPLIFIER WITH IMPROVED OPERATIONAL RANGE

BACKGROUND OF THE INVENTION

1. Field of the Invention

The present invention relates to a differential amplifier, particularly to a variable amplitude type differential amplifier capable of producing an output having an arbitrary magnitude of variation, i.e., amplitude.

2. Prior Art

A circuit configuration of a prior art variable amplitude type differential amplifier is illustrated in FIG. 2.

The differential amplifier in FIG. 2 produces an output 11, and has differential signal sources 9 and 10, transistors 1 to 4, resistors 5 and 6, a voltage source 7 and a constant current source 8. The constant current source 8 includes a voltage source 12, a control voltage source 13 and a transistor 8a. The transistors 1 and 3 are connected in parallel with each other, and the transistors 2 and 4 are also connected in parallel with each other, whereby the differential amplifier includes the transistors 1 to 4 having common by connected emitters.

In the prior art circuit configuration in FIG. 2, the currents flowing into the resistors 5 and 6 are varied by applying input signals from the differential signal sources 9 and 10 to the bases of the transistors 1, 3 and 2, 4 respectively, so as to vary the control voltage source 13 of the constant current source 8. An arbitrary range of amplitude is produced at the output 11 due to the voltage drop caused by the current flowing from a source voltage which is rated by the voltage source 7 into the resistor 5.

Since the transistors 1, 3 and 2, 4 are connected in parallel with one another, the current flowing into the resistor 5 is divided to flow into the transistors 1 and 3, while the current flowing into the resistor 6 is divided to flow into the transistors 2 and 4. That is, since the transistors 1, 3 and 2, 4 are connected in parallel with one another, the amount of current flow per transistor is reduced.

However, in the prior art differential amplifier in FIG. 2, for example, if the amplitude 0.1 V is intended to be produced at the output 11 in case that the resistor 5 has a resistance value 50Ω, the current flowing into the resistor 5 must have a value 2 mA. Since the transistors 1, 3 and 2, 4 are connected in parallel with one another, the amount of current to flow per transistor is further reduced to have a value of 1 mA. If the amplitude 5 V is intended to be produced at the output 11, the current flowing into the resistor 5 has a value of 100 mA, and the amount of current to flow per transistor 1, 3 has a value of 50 mA.

In the prior art differential amplifier in FIG. 2, if an output having large amplitude is intended to be produced at the output 11, it can not be produced at the output 11 unless the large amount of current flows into the resistors 5 and 6 in case that the resistant values of the resistors 5 and 6 are small. Considering the maximum rated current flowing into the transistors I to 4, the number of transistors to be connected in parallel with one another must be increased in order to reduce the current to flow per transistor. As a result, parts necessary for the differential amplifier are increased in number, and the power consumption is increased since a large amount of current flows into the resistors 5 and 6.

If the resistance values of the resistors 5 and 6 are made large, the current flowing into the resistors 5 and 6 can be reduced. However, in this state, if an output having the small amplitude is desired at the output 11, the amount of current flowing into the resistors 5 and 6 is reduced. Further, since the transistors 1, 3 and 2, 4 are connected in parallel with one another, the amount of current to flow per transistor becomes very small. Accordingly, in view of the $I_C-f_T$ characteristic of the transistor, when the amount of collector current flowing into the transistor is very small, the frequency characteristic of the transistor is inferior, so that the frequency characteristic of the variable amplitude type differential amplifier is then deteriorated.

As mentioned above, there is a problem in the prior art variable amplitude type differential amplifier wherein the output amplitude can not be varied to a large extent with low power.

SUMMARY OF THE INVENTION

Accordingly, it is an object of the invention to provide a variable amplitude type differential amplifier capable of reducing consumption power by reducing current flowing into the circuit without deteriorating the frequency characteristic even if the amplitude is varied to a large extent.

To achieve the above object, a differential amplifier according to the present invention comprises a first switching element having an input terminal, an output terminal and a control terminal; a second switching element having an input terminal, an output terminal and a control terminal; a first constant current source connected to output terminals of the first and second switching elements; a third switching element having an input terminal, an output terminal and a control terminal, wherein the control terminal is connected with the control terminal of the first switching element; a fourth switching element having an input terminal, an output terminal and a control terminal, wherein the control terminal is connected with the control terminal of the second switching element; first and second resistors connected between the input terminals of the first and second switching elements and a voltage source; a second constant current source connected to output terminals of the third and fourth switching elements; a third resistor connected between the input terminal of the first switching element and the input terminal third switching element; and a fourth resistor connected between the input terminal of second switching element and the input terminal of the fourth switching element.

For example, npn transistors are employed as the switching elements. In the actual circuit configuration, differential signal sources are connected to the control terminals of the first and third transistors and to the control terminals of the second and fourth transistors, respectively. Further, the third and fourth transistors are not limited to respectively one in number but they may be plural in number and connected in parallel with one another similar to the first and third switching elements being connected with a resistor between the collectors. Still further, the first to fourth switching elements can be subjected to an on-off control by the first and second constant current sources.

The differential amplifier according to the present invention changes the flow path of current flowing into resistors which are respectively connected in the first and second switching elements so as to switch resistance values of the resistors depending on the amplitude of the output to be produced at the output.

BRIEF DESCRIPTION OF THE DRAWINGS

FIG. 1 is a circuit diagram of a variable amplitude type differential amplifier according to a preferred embodiment of the invention;

FIG. 2 is a circuit diagram of a prior art variable amplitude type differential amplifier.

PREFERRED EMBODIMENT OF THE INVENTION

Figure 3:
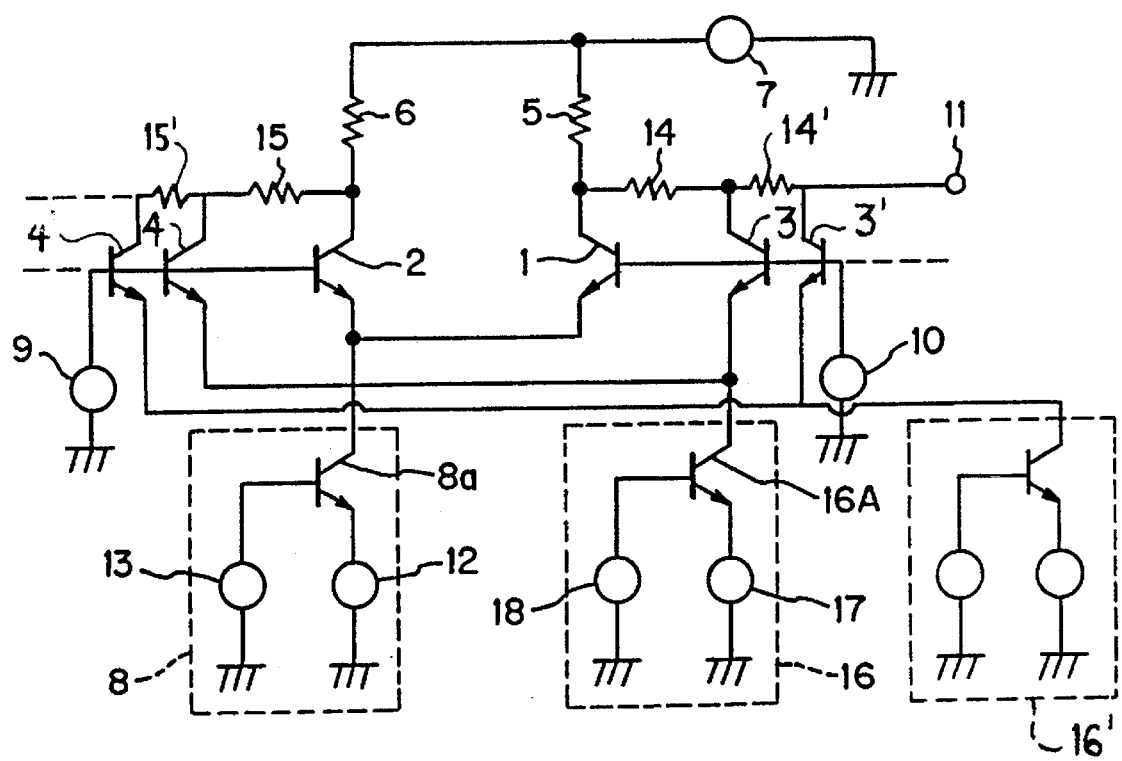
FIG. 3 is a circuit diagram of a further embodiment similar to FIG. 1 and showing additional switching elements.

A variable amplitude type differential amplifier according to a preferred embodiment will be described in FIG. 1. Elements which are the same as those of FIG. 2 are denoted at the same reference numerals.

A circuit configuration of FIG. 1 comprises resistors 14 and 15, and a pedeterminable current source 16 which are added to the elements of the circuit configuration of FIG. 2. In FIG. 1, the resistor 14 is connected between the collector of the transistor 1 and the collector of the transistor 3. The resistor 15 is connected between the collector of the transistor 2 and the collector of the transistor 4. The current source 16 includes a voltage source 17, a control voltage source 18, and a transistor 16A. The differential amplifier of FIG. 1 includes the first and second transistors 1 and 2 having common by connected emitters, and the third and fourth transistors 3 and 4 having common by connected emitters. The current source 8 and the current source 16 are connected to the commonly connected emitters of these transistors respectively.

In the differential amplifier having the circuit configuration shown in FIG. 1, since differential signals are input to the bases of the transistors 1 to 4, the transistors 2 and 4 are turned off when the transistors 1 and 3 are turned on.

When producing an output having a small range of amplitude, the control voltage source 18 of the current source 16 is made the same as or smaller than a voltage as rated by the voltage source 17, so as to turn off the transistors 3, 4. In this state, the control voltage source 13 of the current source 8 is varied so as to largely vary the amount of current flowing into the resistors 5 and 6, thereby producing an arbitrary amplitude at the output 11. In this case, since the transistors 3 and 4 are turned off, the current flowing from the voltage source 7 into the resistor 5 flows into the transistor 1, and the current flowing from the voltage source 7 through the resistor 6 flows into the transistor 2.

If a large range of amplitude is intended to be produced at the output 11, the control voltage source 13 of the current source 8 is made the same as or smaller than the voltage as rated by the voltage source 12 so as to turn off the transistors 1, 2. In this state, the control voltage source 18 of the current source 16 is varied so as to largely vary the amount of current flowing through the resistors 5 and 14, and the resistors 6 and 15.

The current flowing from the voltage source 7 does not flow into the transistors 1 and 2 since the transistors 1 and 2 are turned off, but it flows into the transistors 3 and 4 through the resistor 14 and 15 respectively. In this case, since the resistors 5 and 14 are serially connected with each other, the resistance value of the resistor connected to the collector of the transistor 3 is made large. Accordingly, it is possible to reduce the amount of current which is required for obtaining a large output amplitude.

The current flow path can be switched by turning off the select current source 8 or 16 so as to form either a first current path where the resistor connected to the collector of the transistor is composed of only the resistors 5, 6 or a second current path where the resistors 5 and 14, and 6, 15 are serially connected with each other. The resistance values can be switched by thus divided resistors.

In an actual circuit configuration, in case the amplitude by the voltage drop caused by the current flowing into the resistor 5 is produced at the output 11, a buffer circuit (not shown) having a large input impedance connected to the output 11 can be employed for restraining the voltage drop by the resistor 14.

In the circuit configuration of FIG. 1, supposing that the resistor 5 has a resistance value 20Ω, the resistor 14 has a resistance value 120Ω, if the amplitude 0.1 V is desired at the output 11, the voltage source 17 is controlled to turn off the transistors 3, 4. As a result, the current flowing into the resistor 5 flows into the transistor 1. Accordingly, if the current source 8 is controlled to permit the current having the value 5 mA to flow into the resistor 5, the amplitude 0.1 V is produced at the output 11 by the current having the value 5 mA flowing into the resistor 5 due to the voltage drop.

The voltage level as rated by the voltage source 7 becomes a H level in amplitude, and a level which is smaller than the H level by the amplitude 0.1 V due to the voltage drop becomes a L level in amplitude.

If the amplitude 5 V is intended to be produced at the output 11, the current source 8 is controlled to turn off the transistors 1, 2. When the transistors 1 and 2 are turned off, the current flows from the resistor 5 into the resistor 14, then flows into the transistor 3. The value of resistance connected to the collector of the transistor 3 becomes 140Ω since the resistors 5 and 14 are serially connected to each other. Accordingly, if the current source 16 is controlled so as to permit a current having the value 36 mA to flow into the resistors 5 and 14, an amplitude 5 V is produced at the output 11.

In the prior art differential amplifier of FIG. 2, if the amplitude 0.1 V is intended to be produced at the output 11, the value of the current flowing into the resistor 5 is 2 mA supposing that the resistor 5 has resistance value 50Ω. If the amplitude 5 V is intended to be produced at the output 11, the current having the value 100 mA must flow into the resistor 5.

However, in an actual differential amplifier, since the current sources are connected to each common emitters of the transistors 1, 3 and 2,4 which are connected with common bases and with the resistors 14, 15 connected between the collectors of the transistors 1, 3 and 2, 4 respectively, the resistance values along a select current path can be switched by changing the current flow path when the current sources are controlled.

In the present invention if the amplitude 0.1 V is intended to be produced at the output 11, the value of the current flowing into the resistor 5 is 5 mA, and if the amplitude 5 V is intended to be produced at the output 11, the value of the current flowing into the resistor 5 is about 36 mA. Accordingly, the maximum current to flow into the resistor 5 is reduced to one third of that in the prior art differential amplifier, thereby remarkably reducing the consumption power.

In the circuit configuration of FIG. 1, each of the transistors 1 to 4 may have a cascade-connection structure, which has however the same effect as the present invention.

The npn transistors employed in the aforementioned preferred embodiment may be replaced by pnp transistors or other switching elements, which have, however, the same effect as the present invention.

According to the present invention, since the resistance path of the current through the resistors can be switched by selectively changing flow path of the current flowing into the resistors connected between the switching elements, power consumption can be reduced by reducing the current flowing into the circuit without deteriorating the frequency characteristic thereof even if the amplitude is varied to a large extent.

What is claimed is:

1. A differential amplifier comprising:

a first switching element having an input terminal, an output terminal and a control terminal;

a second switching element having an input terminal, an output terminal and a control terminal;

a first current source connected to said output terminals of said first and second switching elements for predetermined activation and deactivation of said first and second switching elements;

a third switching element having an input terminal, an output terminal and a control terminal, wherein said control terminal of said third switching element is connected to said control terminal of said first switching element;

a fourth switching element having an input terminal, an output terminal and a control terminal, wherein said control terminal of said fourth switching element is connected to said control terminal of said second switching element;

first and second resistors connected between respective said input terminals of said first and second switching elements and a first voltage source;

a second current source connected to said output terminals of said third and fourth switching elements for predetermined activation and deactivation of said third and fourth switching elements;

a third resistor connected between said input terminal of said first switching element and said input terminal of said third switching element; and a fourth resistor connected between said input terminal of said second switching element and said input terminal of said fourth switching element.

2. A differential amplifer according to claim 1, wherein said first, second third and fourth switching elements are respectively transistors.

3. A differential amplifier according to claim 1, wherein said first, second, third and fourth switching elements are respectively npn transistors.

4. The differential amplifier according to claim 1, further comprising differential signal sources connected to said control terminals of said first and third switching elements and to said control terminals of said second and fourth switching elements.

5. The differential amplifier according to claim 2, further comprising differential signal sources connected between said control terminals of said first and third switching elements and between said control terminals of said second and fourth switching elements.

6. The differential amplifier according to claim 3, further comprising differential signal sources connected between said control terminals of said first and third switching elements and between said control terminals of said second and fourth switching elements.

7. A differential amplifier according to claim 1, wherein said first, second, third and fourth switching elements are subjected to an on-off control by said first and second current sources.

8. A differential amplifier according to claim 2, wherein said first, second, third and fourth switching elements are subjected to on-off control by said first and second current sources.

9. A differential amplifier according to claim 3, wherein said first, second, third and fourth switching elements are subjected to on-off control by said first and second current sources.

10. The differential amplified according to claim 1, further comprising, a fifth switching element having an input terminal, a control terminal, and an output terminal, said control terminal of said fifth switching element is connected to the commonly connected control terminals of said first and third switching elements, said input terminal of said fifth switching element is connected to said input terminal of said third switching element through a fifth resistor, a sixth switching element having an input terminal, a control terminal, and an output terminal, said control terminal of said sixth switching element is connected to the commonly connected control terminals of said second and fourth switching elements, said input terminal of said sixth switching element is connected to said input terminal of said fourth switching element through a sixth resistor, and a third current source connected to said output terminals of said fifth and sixth switching elements.

11. The differential amplifier according to claim 2, further comprising, a fifth switching element having an input terminal, a control terminal, and an output terminal, said control terminal of said fifth switching element is connected to the commonly connected control terminals of said first and third switching elements, said input terminal of said fifth switching element is connected to said input terminal of said third switching element through a fifth resistor, a sixth switching element having an input terminal, a control terminal, and an output terminal, said control terminal of said sixth switching element is connected to the commonly connected control terminals of said second and fourth switching elements, said input terminal of said sixth switching element is connected to said input terminal of said fourth switching element through a sixth resistor, and a third current source connected to said output terminals of said fifth and sixth switching elements.

12. The differential amplifier according to claim 3, further comprising, a fifth switching element having an input terminal, a control terminal, and an output terminal, said control terminal of said fifth switching element is connected to the commonly connected control terminals of said first and third switching elements, said input terminal of said fifth switching element is connected to said input terminal of said third switching element through a fifth resistor, a sixth switching element having an input terminal, a control terminal, and an output terminal, said control terminal of said sixth switching element is connected to the commonly connected control terminals of said second and fourth switching elements, said input terminal of said sixth switching element is connected to said input terminal of said fourth switching element through a sixth resistor, and a third current source connected to said output terminals of said fifth and sixth switching elements.

13. The differential amplifier according to claim 1, wherein the first current source and the second current source alternately activate said first and second switching elements and said third and fourth switching elements respectively.

14. The differential amplifier according to claim 13, wherein said first current source includes a switching element with an input terminal connected to said output terminals of said first and second switching elements, a control terminal connected to a second voltage source, and an output terminal connected to a third voltage source; wherein said second voltage source has a generally smaller voltage than said third voltage source when said first and second switching elements are in a deactivated state; and wherein said second voltage source has a generally greater voltage than said third voltage source when said first and second switching elements are in an activated state.

15. The differential amplifier according to claim 13, wherein said second current source includes a switching element with an input terminal connected to said output terminals of said third and fourth switching elements, a control terminal connected to a second voltage source, and an output terminal connected to a third voltage source; wherein said second voltage source has a generally smaller voltage than said third voltage source when said third and fourth switching elements are in a deactivated state; and wherein said second voltage source has a generally greater voltage than said third voltage source when said third and fourth switching elements are in an activated state.

* * * * *

UNITED STATES PATENT AND TRADEMARK OFFICE
CERTIFICATE OF CORRECTION

PATENT NO. : 5 614 865
DATED : March 25, 1997
INVENTOR(S) : Mitsutada Hanajima

It is certified that error appears in the above-indentified patent and that said Letters Patent is hereby corrected as shown below:

Column 5, line 41; change "claim 1," to ---claim 13,---.

Signed and Sealed this

Fourteenth Day of October, 1997

Attest:

BRUCE LEHMAN

Attesting Officer

Commissioner of Patents and Trademarks